United States Patent
Kern et al.

(10) Patent No.: US 10,951,240 B2
(45) Date of Patent: Mar. 16, 2021

(54) DETECTION OF CODEWORDS

(71) Applicant: Infineon Technologies AG, Neubiberg (DE)

(72) Inventors: Thomas Kern, Aschheim (DE); Michael Goessel, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/716,735

(22) Filed: Dec. 17, 2019

(65) Prior Publication Data

US 2020/0350931 A1  Nov. 5, 2020

(30) Foreign Application Priority Data

Dec. 17, 2018 (DE) .................. 10 2018 132 503.7

(51) Int. Cl.
*H03M 13/00* (2006.01)
*H03M 13/39* (2006.01)
*H03M 13/25* (2006.01)

(52) U.S. Cl.
CPC ....... *H03M 13/3988* (2013.01); *H03M 13/25* (2013.01); *H03M 13/6561* (2013.01)

(58) Field of Classification Search
None
See application file for complete search history.

(56) References Cited

U.S. PATENT DOCUMENTS

| | | | |
|---|---|---|---|
| 9,570,169 B1* | 2/2017 | Czornomaz | H01L 45/122 |
| 9,805,771 B2 | 10/2017 | Kern | |
| 2010/0281340 A1 | 11/2010 | Franceschini | |
| 2013/0322168 A1* | 12/2013 | Close | G11C 13/0004 365/163 |
| 2014/0219001 A1 | 8/2014 | Patapoutian | |
| 2014/0269029 A1* | 9/2014 | Kinney | G06F 11/0751 365/158 |
| 2014/0369114 A1* | 12/2014 | Kim | H01L 45/06 365/163 |
| 2015/0003144 A1* | 1/2015 | Eleftheriou | H01L 45/08 365/148 |
| 2017/0139641 A1* | 5/2017 | Cha | G11C 11/4076 |
| 2019/0097128 A1* | 3/2019 | Jonnalagadda | G11C 13/0069 |

* cited by examiner

*Primary Examiner* — Mujtaba M Chaudry
(74) *Attorney, Agent, or Firm* — Eschweiler & Potashnik, LLC

(57) ABSTRACT

A method for detecting a code word is proposed, wherein the code word is a code word of one of at least two codes, wherein n states are read from memory cells of a memory, respectively. The n states are determined in a time domain for each of the at least two codes, wherein additionally n states are read from further memory cells and at least one reference value is determined therefrom and wherein the at least one reference value is taken as a basis for determining which of the at least two codes is the correct code. A corresponding device is furthermore specified.

18 Claims, 11 Drawing Sheets

| | | | | | | | | |
|---|---|---|---|---|---|---|---|---|
| Cell$_5$ | LRS | LRS | LRS | LRS | LRS | LRS | HRS | HRS |
| Cell$_4$ | LRS | LRS | LRS | LRS | HRS | HRS | HRS | HRS |
| Cell$_3$ | LRS | HRS | LRS | HRS | LRS | LRS | LRS | HRS |
| Cell$_2$ | HRS | LRS | HRS | LRS | HRS | HRS | HRS | LRS |
| Cell$_1$ | HRS | HRS | LRS | HRS | HRS | LRS | LRS | LRS |
| Cell$_0$ | HRS | HRS | HRS | LRS | HRS | HRS | LRS | LRS |

Fig.2

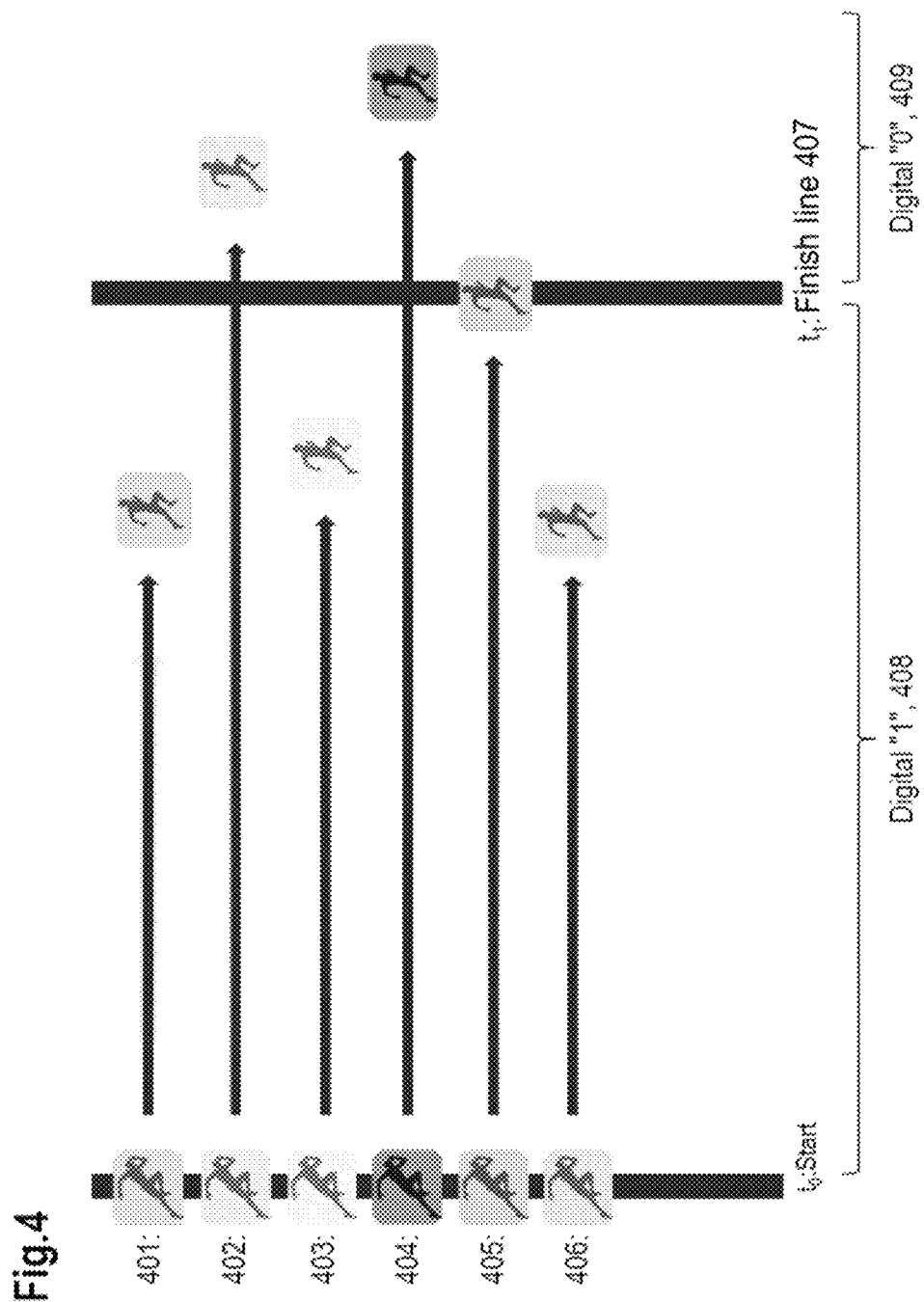

DETECTION OF CODEWORDS

REFERENCE TO RELATED APPLICATION

This application claims priority to German Application No. 10 2018 132 503.7, filed on Dec. 17, 2018, the contents of which are hereby incorporated by reference in their entirety.

BACKGROUND

The invention relates to the detection of code words of various k-out-of-n codes.

U.S. Pat. No. 9,805,771 B2 discloses the evaluation of states which are read from memory cells to transform them into the time domain and to utilize states arriving earlier in time accordingly for efficient read-out of memory cells.

SUMMARY

One embodiment of the disclosure is directed to improving existing solutions and in particular providing an approach for the detection of code words, each of which can be a code word from a plurality of k-out-of-n codes (having a different value for k per code).

A method is proposed for detecting a code word, wherein the code word is a code word of one of at least two codes. The method comprises reading n states are read from memory cells of a memory, respectively, and determining the n states in a time domain for each of the at least two codes. The method also comprises reading n additional states from further memory cells and determining at least one reference value therefrom. The method also comprises taking at least one reference value as a basis for determining which of the at least two codes is the correct code.

It should be noted here that the term "code word" denotes a valid allocation of bits in accordance with the predefined code. The code word thus fulfils the properties of a code. This correspondingly applies to different code words of different codes.

The code word to be detected is, in particular, a code word of one of at least two codes, each of which can be a k-out-of-n code having a different value for k per code.

Further explanation is given below of how the states are determined in the time domain. Supplementarily, in this regard, reference may also be made to U.S. Pat. No. 9,805,771 B2. As a result of transforming the variables to be detected into the time domain, the individual states occur successively in time. By way of example, 0-states occur before the 1-states (the designations 0-state and 1-state have been chosen by way of example for illustration purposes). Consequently, after the arrival of the k 0-states, the determination of the n states can be ended and the value 1 can be assigned to the n−k remaining states (there is no need to wait until the 1-states have been determined because, on account of the k-out-of-n code, there are k 0-states and (n−k) 1-states).

In one embodiment, the code word of the correct code is processed further.

In one embodiment, each of the at least two codes is a k-out-of-n code having an identical value n and different values for k.

In one embodiment, the at least two codes comprise a first k1-out-of-n code and a second k2-out-of-n code, wherein the reference value is determined such that it is based on a bit sequence corresponding to a k3-out-of-n code, wherein the value k3 lies between the values k1 and k2.

In one embodiment, the n states are determined at least partly in parallel and/or at least partly simultaneously.

In one embodiment, the n states are read from the further memory cells of the memory or of some other memory.

In one embodiment, the at least one reference value is taken as a basis for determining which of the at least two codes is the correct code, by an integrated signal being determined by integration of signals supplied by the n cells and by the integrated signal being compared with the at least one reference value.

In one embodiment, the at least one reference value is determined, by a further integrated signal being determined by integration of signals supplied by the n further cells.

In one embodiment, the at least one reference value is determined for each read process of the cells from the memory.

In one embodiment, the memory cells are read in groups of n memory cells.

In one embodiment, the memory cells are complementary memory cells of a complementary memory.

The complementary memory can be a differential read memory, in particular.

In one embodiment, the states are determined in the time domain by a number of k fastest states being determined.

In one embodiment, the fastest states are 0-states.

In one embodiment, the remaining states that do not belong to the k fastest states are correspondingly set.

If the fastest states are 0-states, then after determining the k-th 0-state, those states for which an assignment has not yet been effected can be set as 1-states.

In one embodiment, the memory comprises at least one of the following memories:

floating gate cells;
PCRAM,
RRAM,
MRAM,
MONOS components,
nanocrystal cells, and
ROM.

In one embodiment, the method is carried out by a processing circuit arranged functionally between the memory and an error processing facility coupled to a system bus.

In this case, the processing circuit can comprise software, hardware or mixed forms (firmware).

Moreover, a device for detecting a code word is proposed, wherein the code word is a code word of one of at least two codes, comprising a processing circuit configured for carrying out the method described herein.

The device can be embodied in one component or in a distributed fashion in a plurality of components. Moreover, the processing circuit can comprise the error processing facility or be embodied separately from the latter. The memory can be part of the device or be embodied separately from the latter.

The processing circuit mentioned here can be embodied in particular as a processor circuit and/or an at least partly hardwired or logic circuit arrangement, which is configured for example in such a way that the method as described herein is implementable. Said processing circuit can be or comprise any type of processor or computer with correspondingly required peripherals (memories, input/output interfaces, input-output devices, etc.).

The above explanations concerning the method are correspondingly applicable to the device.

Moreover, the method mentioned above is achieved by means of a system comprising at least one of the devices described here.

Furthermore, a system is specified comprising at least one of the devices described here.

Moreover, a system is specified, comprising at least one of the devices described here.

Moreover, a device is proposed for detecting a code word, wherein the code word is a code word of one of at least two codes, wherein the device comprises means for reading n states from memory cells of a memory, respectively, and means for determining the n states in a time domain for each of the at least two codes. The device further comprises means for reading n additional states from further memory cells and for determining at least one reference value on the basis of the states read from the further memory cells, and means for determining which of the at least two codes is the correct code on the basis of the at least one reference value.

Furthermore, a non-transitory computer readable storage medium containing instructions is disclosed. The instructions are loadable into a memory of a digital computer, comprising program code parts suitable for executing the instructions, thus carrying out steps of the method described here.

Furthermore, the problem mentioned above is solved by means of a non-transitory computer-readable storage medium, e.g. of an arbitrary memory, comprising computer-executable instructions (e.g. in the form of program code) suitable for the computer to carry out steps of the method described here.

The above-described properties, features and advantages and the way in which they are achieved are explained further in association with the following schematic description of exemplary embodiments which are explained in greater detail in association with the drawings. In this case, identical or identically acting elements may be provided with identical reference signs for the sake of clarity.

BRIEF DESCRIPTION OF THE FIGURES

FIG. 2 shows a table illustrating how 20 different states are represented on the basis of 6 memory cells $Cell_0$ to $Cell_5$;

FIG. 4 shows a diagram illustrating by way of example the temporal measurement of the states "0" and "1" from memory cells;

DETAILED DESCRIPTION

The use of new memory technologies such as MRAM, RRAM or PCRAM affords cost advantages and improves compatibility with respect to the CMOS production process.

However, it is a challenge to cope with small read windows between the individual states, e.g. between 0-states and 1-states.

Figure 1:
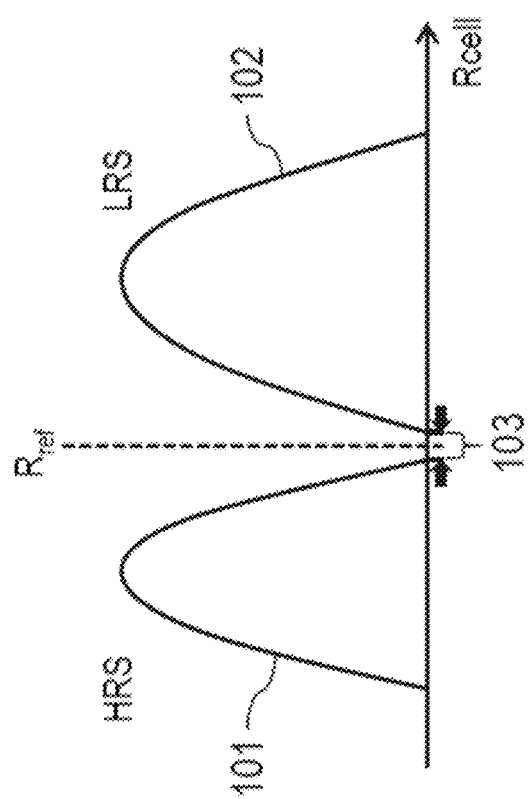
FIG. 1 shows an example diagram comprising two (frequency) distributions for cell resistances of memory cells.

FIG. 1 shows an example diagram comprising two (frequency) distributions 101 and 102 for cell resistances of memory cells, between which a read window 103 is located. The distribution 101 shows for example a high resistive state (HRS) and the distribution 102 correspondingly shows by way of example a low resistive state (LRS). The read window 103 is arranged around a reference value $R_{ref}$.

Positioning of the reference value $R_{ref}$ for separating the two distributions 101 and 102 is problematic with regard to a high reliability and robustness of the differentiation of the states of the distributions 101 and 102. In addition, the unambiguous differentiation between HRS and LRS is made more difficult by the fact that the memory alters its properties as a result of aging and/or under temperature influences: By way of example, the size and/or position of the read window 103 can change as a result. Moreover, it is possible as a result for the distributions 101 and 102 to approach or even overlap one another.

In order to alleviate this problem, complementary memory cells can be used. By way of example, two or a plurality of complementary memory cells can be used. In complementary memory cells, a data bit is represented by (at least) two physical memory cells, which have complementary states in the error-free case. By way of example, if two complementary memory cells A1 and A2 are used to represent a logic data bit, then the following can hold true:

A logic value "0" is present if the following holds true for the complementary memory cells A1 and A2: A1=0 and A2=1.

A logic value "1" is present if the following holds true for the complementary memory cells A1 and A2: A1=1 and A2=0.

In the error-free case, the two memory cells A1 and A2 thus always have complementary values: if the memory cell A1 carries the value 0, then the memory cell A2 carries the value 1, and vice versa.

Complementary memory cells can be used e.g. for arbitrary k-out-of-n codes. The example embodiment explained here describes an example implementation based on a 3-out-of-6 code. A code word of the 3-out-of-6 code has 6 bits (states), of which 3 always have either the value 0 or the value 1 and the remaining 3 memory cells then have the value complementary thereto.

By way of example, 6 physical memory cells can be provided, which are utilized by means of a complementary approach for coding e.g. 4 bits.

FIG. 2 shows a table illustrating how 20 different states are represented on the basis of 6 memory cells $Cell_0$ to $Cell_5$. Each of the memory cells can assume a high resistive state (HRS) or a low resistive state (LRS). Each of the states corresponds to a value allocation of these 6 memory cells $Cell_0$ to $Cell_5$ and also to a code word of the 3-out-of-6 code.

For a k-out-of-n code it generally holds true that there are $$\binom{n}{k}$$

code words, each having k first values and (n–k) second values. The following holds true $$\binom{n}{k} = \frac{n!}{k! \cdot (n-k)!}$$

and thus for the 3-out-of-6 code $$\binom{6}{3} = \frac{6!}{3! \cdot (6-3)!} = \frac{6!}{3! \cdot 3!} = \frac{120}{6} = 20.$$

Thus, in the case of the 3-out-of-6 code, there are a total of 20 code words in which three bits have a first value and the other three bits have a second value. These code words can be used to map e.g. $2^4=16$ states (that is to say to code 4 bits), wherein 4 of the 20 code words remain unused for this.

Figure 3A:
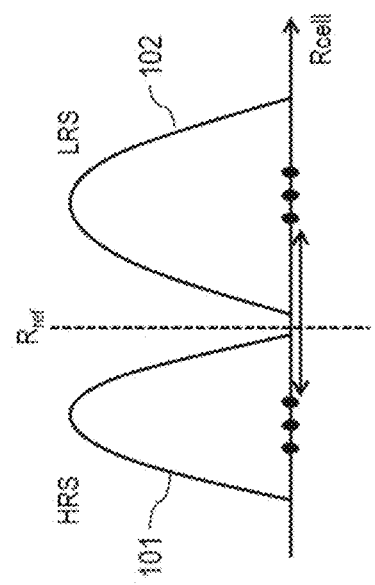
FIG. 3A shows an example diagram based on FIG. 1, wherein, in contrast to FIG. 1, resistance values Rcell of a total of 6 memory cells are depicted, wherein 3 memory cells have a low resistive state (LRS) and 3 memory cells have a high resistive state (HRS)

FIG. 3A shows an example diagram based on FIG. 1, wherein, in contrast to FIG. 1, resistance values Rcell of a total of 6 memory cells are depicted, wherein 3 memory cells have a low resistive state (LRS) and 3 memory cells have a high resistive state (HRS). As also in FIG. 1, the abscissa shows the resistance value Rcell of the respective cell.

Figure 3B:
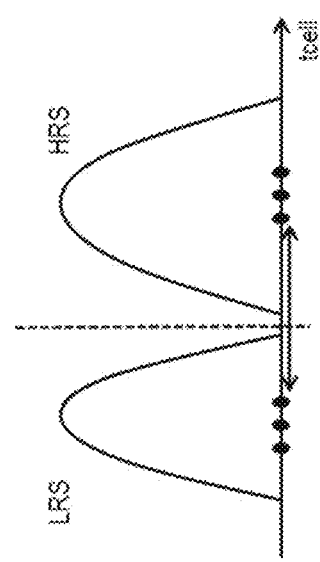
FIG. 3B shows an example diagram based on FIG. 3A after a transformation into the time domain.

FIG. 3B shows an example diagram based on FIG. 3A, wherein, in contrast to FIG. 3A, after a transformation into the time domain, the abscissa represents a time tcell. The determination of the individual states of the memory cells can accordingly take place in a time-dependent manner.

By way of example, the 0-state (e.g. the LRS) can be measured faster than the 1-state (e.g. the HRS): if, therefore, in accordance with the above example of the 3-out-of-6 code, the 0-state was determined three times, then (in the case of an error-free measurement) it is already certain upon the determination of the third 0-state that the remaining three states that have not yet been determined must be 1-states. Consequently, the code word can already be determined prematurely as soon as just the three faster 0-states have been determined. There is no need to wait for the arrival of the slower 1-states.

It should be noted that it is assumed here by way of example that the 0-states on average can be determined before the 1-states. In principle, it suffices if a first state can be determined faster than a second state.

One example embodiment for determining three fastest 0-states is described for example in U.S. Pat. No. 9,805,771 B2, which also described in detail how, proceeding from a hold signal determined by a logic circuit, a multiplicity of latches (e.g. a latch can be realized as a D-type flip-flop, see e.g. https://de.wikipedia.org/wiki/Latch) are halted or the state of these latches is frozen. This mechanism of freezing the latches can also be realized for the present implementation.

FIG. 4 shows a diagram illustrating by way of example the temporal measurement of the states "0" and "1". Each of the memory cells 401 to 406 represents one of these two states. In the example shown in FIG. 4, the following allocation of the memory cells holds true by way of example:

Memory cell 401: State "1",
Memory cell 402: State "0",
Memory cell 403: State "1",
Memory cell 404: State "0",
Memory cell 405: State "0",
Memory cell 406: State "1".

As has already been explained, the 0-state corresponds for example to a low resistance value (LRS) in accordance with the distribution 102 and the 1-state then corresponds to a high resistance value (HRS) in accordance with the distribution 101. The transformation into the time domain has the result that the LRS "0" can be determined earlier than the HRS "1".

A memory cell in the 0-state (having the value 0) has a lower resistance value than a memory cell in the 1-state (having the value 1); therefore, a higher current flows through the memory cell having the value 0. If said current is integrated over time by means of a capacitance, a voltage results. This voltage rises more steeply with time and reaches a predefined threshold value significantly earlier than if the memory cell had the value 1 and accordingly were more highly resistive (and a lower current thus flowed). It follows from this that memory cells having the value 0 can be determined earlier in time than memory cells having the value 1.

The illustration chosen in FIG. 4 uses the analogy of a race in this sense, wherein the memory cell having the lowest resistance value (and thus the largest gradient of the integrated current over time) is the first to reach a finish line 407.

Accordingly, the measurement begins at a point in time $t=t_0$ ("Start") and the first three 0-states for the memory cells 404, 402 and 405 were already able to be determined at a point in time $t=t_1$ ("Finish line"). The other memory cells 401, 403 and 406 have not yet reached the finish line, i.e. have not reached the voltage threshold value by means of the integration described.

During the measurement, the temporal sequence in which the memory cells reached the finish line (that is to say the threshold value in the case of the integration of the current) is known; that being in the present case: firstly the memory cell 404, then the memory cell 402 and lastly the memory cell 405.

In the present example of the 3-out-of-6 code, exactly 3 of the 6 memory cells have the 0-state and the remaining three memory cells have the 1-state. Since the 0-state can be ascertained earlier than the 1-state, the measurement can be ended as soon as the third (and thus last) 0-state was able to be determined. This holds true under the assumption that the 0-states can actually be determined earlier than the 1-states.

Consequently, the finish line 407 subdivides the possible states of the memory cells 401 to 406 into two ranges, a range 408 for the 1-states and a range 409 for the 0-states. Distinctly more time would thus be required for the memory cells having the 1-state to reach the predefined voltage threshold value. These memory cells (the memory cells 401, 403 and 406 in the example in FIG. 4) have not yet reached the finish line 407 at the point in time $t_1$, at which three 0-states have already been able to be determined. The third 0-state was able to be determined at this point in time $t_1$. This is also the point in time at which the measurement can be ended and at which the states of the measurement amplifiers connected to the memory cells can be frozen. In the present example, three 0-states for the memory cells 404, 402 and 405 are present after freezing. The remaining three states for the memory cells 401, 403 and 406 are set to 1 in each case.

To summarize, the code word can thus be determined as soon as the first three states "0" are present. In the example shown in FIG. 4, the code word 101001 (LSB corresponds to the memory cell 406) can be determined at the time $t_1$.

It is proposed below to combine a plurality of different k-out-of-n codes in order thus to create additional states, such that a total of $2^m$ states are attained, for example, which can be represented by m bits, wherein it advantageously holds true that m is less than n.

Example 1

By way of example, it is proposed to combine the following k-out-of-n codes $$\left( \binom{n}{k} \right)$$

code is also used as notation for this):

the $\binom{6}{3}$ code yields 20 states (code words);

the $\binom{6}{1}$ code yields 6 states (code words);

the $\binom{6}{5}$ code yields 6 states (code words).

Overall, therefore, this results in $$20+6+6=32=2^5$$

code words, which can be represented by m=5 bits. In this case, it is necessary to be able efficiently to distinguish the code words of the different codes from one another, i.e. the intention is to be able to determine efficiently whether a code word of the $$\binom{6}{3}$$

code, of the $$\binom{6}{1}$$

code or of the $$\binom{6}{5}$$

code is present. In other words, a plurality of different k-out-of-n codes (where a different value for k is used per code) can thus be combined in order to utilize as far as possible all $2^m$ states which can be represented by m bits.

Example 2

In another example, the following k-out-of-n codes are combined:

the $\binom{8}{4}$ code yields 70 states (code words);

the $\binom{8}{2}$ code yields 28 states (code words);

the $\binom{8}{6}$ code yields 28 states (code words);

the $\binom{8}{0}$ code yields 1 state (code word);

the $\binom{8}{8}$ code yields 1 state (code word).

Overall, therefore, this results in $$70+28+28+1+1=128=2^7$$

code words, which can be represented by m=7 bits. In this example, too, n>m (8>7) once again holds true.

Differentiation Between Code Words of Different Codes:

Example 1 is taken as a basis below, in which code words of the $$\binom{6}{3}$$

code, of the $$\binom{6}{1}$$

code and of the $$\binom{6}{5}$$

code are combined.

Figure 5:
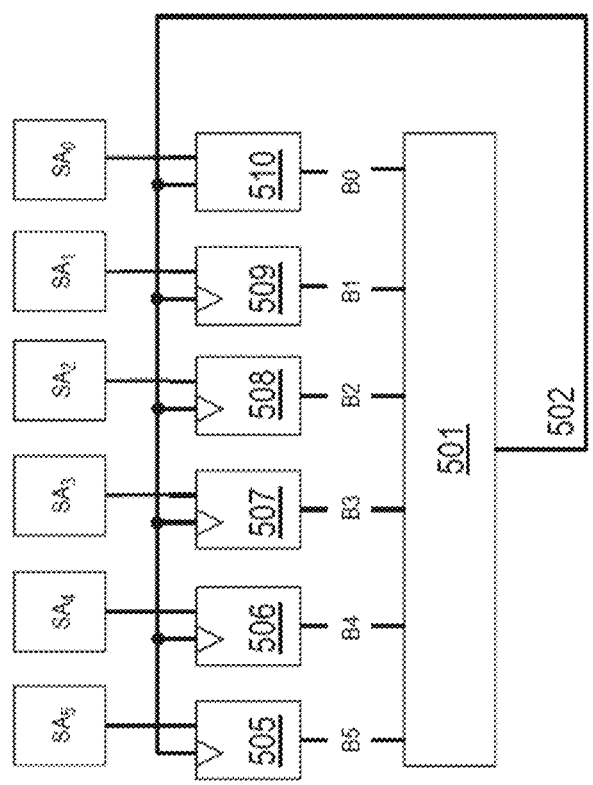
FIG. 5 shows an example circuit arrangement for detecting the k fastest states (bits) of a k-out-of-n code.

FIG. 5 shows an example circuit arrangement for detecting the k fastest states (bits) of a k-out-of-n code (it holds true here by way of example that k=3 and n=6).

Figure 6:
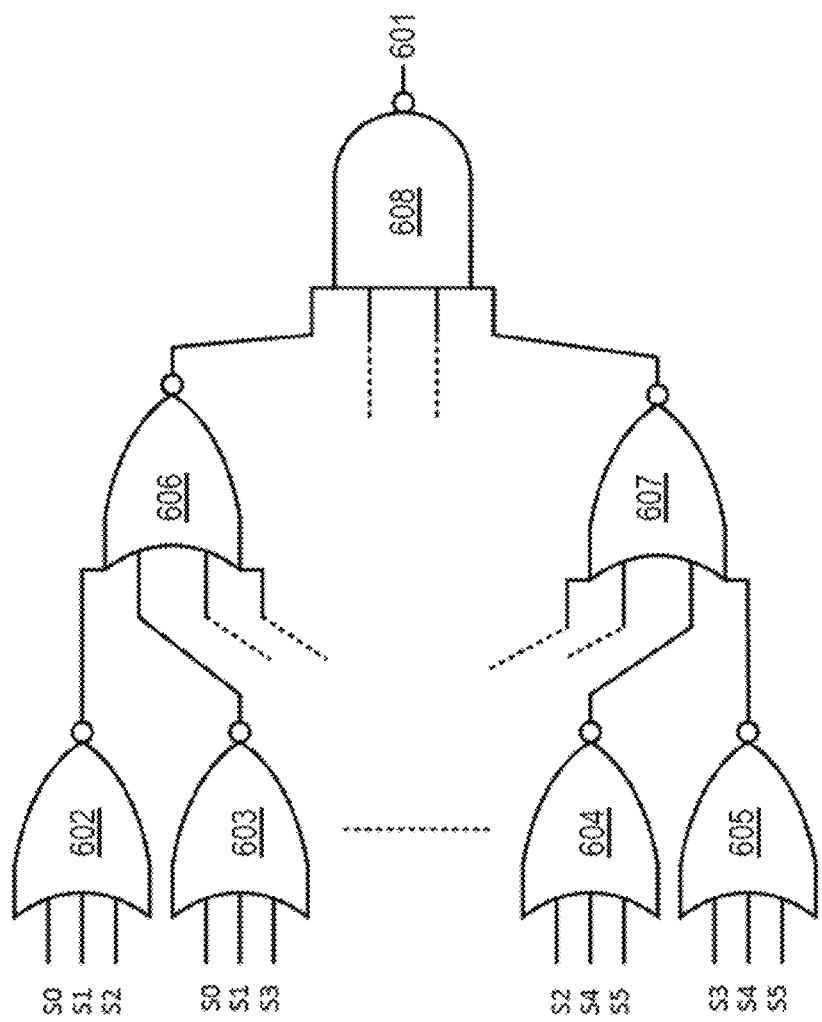
FIG. 6 shows an example realization of the block 501 from FIG. 5 as a logic circuit for determining the three fastest 0-states of a 3-out-of-6 code.

A block 501 comprises an associated logic circuit, which is explained in even greater detail below. By way of example, each logic circuit which enables the k fastest 0-states to be identified can be accommodated in the block 501. FIG. 6 describes how, at the point in time of the occurrence of the k fastest 0-states, all states can be frozen and thus registered by means of such a logic circuit.

Measurement amplifiers $SA_0$ to $SA_5$ supply states S0 to S5 of the memory cells of a memory. These states are fed to the block 501 via latches 505 to 510 (e.g. realized as D-type flip-flops). In the block 501, the k fastest 0-states are detected and the states of the latches 505 to 510 are then frozen ("latched") via a connection 502.

As soon as an output signal of the block 501 thus switches over from 0 to 1 via the connection 502, the k fastest 0-states have been detected and the latches 505 to 510 are halted in such a way that the output signals provided by them no longer change. At this "frozen" point in time, therefore, the k fastest 0-states are present at the outputs of the latches 505 to 510. At the outputs of the latches 505 to 510, the states can be tapped off in the form of the bits B0 to B5 and processed further and/or stored.

FIG. 6 shows an example realization of the block 501 as a logic circuit. By way of example, the three fastest 0-states of a 3-out-of-6 code are determined here. An output signal 601 changes from 0 to 1 as soon as these three fastest 0-states have been determined.

The output signal 601 is determined on the basis of the six states S0 to S5 of the memory cells. In this case, each state is provided as a signal for a memory cell by the measurement amplifier (sense amplifier) $SA_0$ to $SA_5$. Accordingly, the states S0 to S5 correspond to signals (0 or 1) of the 6 memory cells.

The states S0 to S5 are provided in the form of binary values.

In the case of the 3-out-of-6 code, after the third 0-state has arrived, it can be deduced that the remaining states have the value 1. Following this example, the circuit in accordance with FIG. 6 exhibits a logic circuit for detecting the three fastest bits, which—as has been explained above—are 0-states (that is to say have the value 0). If the output signal 601 has the value 1, this indicates that the value 0 was identified three times at the outputs of the measurement amplifiers.

The circuit in accordance with FIG. 6 uses NOR gates by way of example for this purpose. A multiplicity of NOR gates are provided at the input, each of said gates having three inputs and an output. For each code word, three of the 6 states S0 to S5 always have the value 0, that is to say that the possible code words yield 20 combinations in which exactly one selection of three of the states S0 to S5 is equal to 0. These combinations correspond to the allocations of the inputs of the total of 20 NOR gates 602 to 605 (for the sake of clarity, not all 20 NOR gates are depicted, but rather only a selection of four NOR gates).

In this regard, by way of example, the inputs of the NOR gate 602 are connected to the states S0, S1 and S2. Correspondingly, the inputs of the NOR gate 603 are connected to the states S0, S1 and S3. Finally, the inputs of the NOR gate 604 are connected to the states S2, S4 and S5. The inputs of the NOR gate 605 are connected to the states S3, S4 and S5.

Consequently, each of these NOR gates 602 to 605 yields the value 1 at its output only if all of its inputs have the value 0.

The subsequent example implementation comprising five NOR gates 606 to 607 (each having four inputs) and one NAND gate 608 (having five inputs) corresponds to an ORing of the outputs of all the NOR gates 602 to 605 to form the output signal 601.

In this regard, in FIG. 6, by way of example, each output of one of the NOR gates 602 to 605 is connected to an input of one of the downstream NOR gates 606 to 607. The outputs of the NOR gates 606 to 607 are connected to the inputs of the NAND gate 608.

The output signal 601 has the value 1 only if three fastest bits have been identified. If three fastest bits have not been identified, then all the output signals of the NOR gates 602 to 605 have the value 0, the outputs of the NOR gates 606 to 607 are all 1 and the output signal 601 has the value 0. However, as soon as the value 0 is present at three of the six possible states S0 to S5, the relevant NOR gate 602 to 605, which maps exactly this combination of three at its inputs, switches from 0 to 1 at its output; the output of the relevant NOR gate 606 to 607 thus also switches from 1 to 0, as a result of which the output signal 601 of the NAND gate 608 toggles from 0 to 1.

Generally, the identification of the k fastest 0-states can be carried out by means of a circuit having in a first level one of the number of NOR gates which corresponds to the k-out-of-n possible combinations. In this case, each of the NOR gates has k inputs and each of the NOR gates maps at its inputs one of the k-out-of-n possible combinations in which k 0-states can occur. The outputs of the NOR gates are then logically ORed to form an output signal. By way of example, this logic ORing can be realized by a two-stage use of NOR gates and a NAND gate, as shown in FIG. 6. The output signal indicates with a value 1 that k 0-states are present. Otherwise the output signal has the value 0.

A plurality of such logic circuits can be used to determine different numbers k1, k2, etc. of 0-states. Whenever the output signal of the respective logic circuit has the value 1, the 0-states are registered. It is thus possible to determine which k1, k2, etc. 0-states occur or have occurred.

In accordance with the above example, the three fastest bits, the (one) fastest bit and the five fastest bits are thus intended to be detected. A circuit arrangement in accordance with FIGS. 5 and 6 described above can be used in each case for this purpose.

Figure 7:
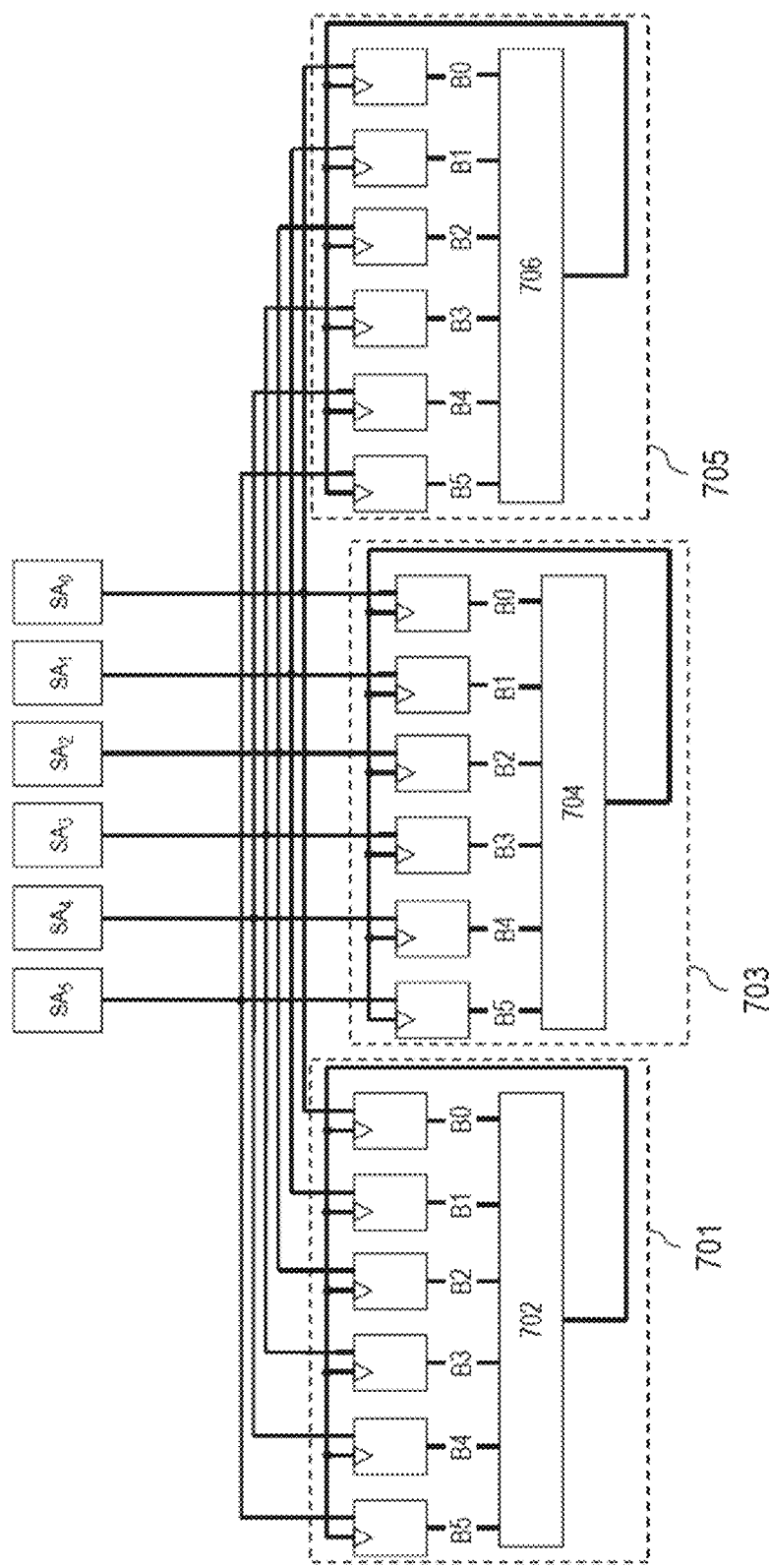
FIG. 7 shows a circuit arrangement for detecting the fastest bit of a 1-out-of-6 code, the three fastest bits of a 3-out-of-6 code and the five fastest bits of a 5-out-of-6 code.

FIG. 7 shows by way of example a circuit arrangement for detecting the fastest bit of a 1-out-of-6 code, the three fastest bits of a 3-out-of-6 code and the five fastest bits of a 5-out-of-6 code.

For detecting the fastest bit of the 1-out-of-6 code, FIG. 7 comprises a circuit block 701 having a logic circuit 702.

For detecting the three fastest bits of the 3-out-of-6 code, FIG. 7 comprises a circuit block 703 having a logic circuit 704.

For detecting the five fastest bits of the 5-out-of-6 code, FIG. 7 comprises a circuit block 705 having a logic circuit 706.

With regard to the circuit blocks 701, 703 and 705, reference is made to FIG. 5 above. The logic circuits 702, 704 and 706 have been explained in greater detail in association with FIG. 6. In particular, the circuit block 703 corresponds to the circuit shown in FIG. 5, and FIG. 6 shows an exemplary implementation for the logic circuit 704.

Consequently, the circuit arrangement shown in FIG. 7 is taken as a basis for identifying whether the bit combination provided from the memory cells with the aid of the measurement amplifiers $SA_0$ to $SA_5$ is a code word of the 1-out-of-6 code, of the 3-out-of-6 code or of the 5-out-of-6 code.

However, for this purpose it is necessary to additionally distinguish which of the codes for the bit combination currently provided by the measurement amplifiers $SA_0$ to $SA_5$ is the correct code.

Identification of the Code and Further Processing of Identified Code Words

In order to determine which of the codes is the correct code, a code identification unit is supplemented in one embodiment. For this purpose, by way of example, the signals provided by the measurement amplifiers are transformed into a voltage. This voltage can then be compared with at least one reference value.

Figure 8:
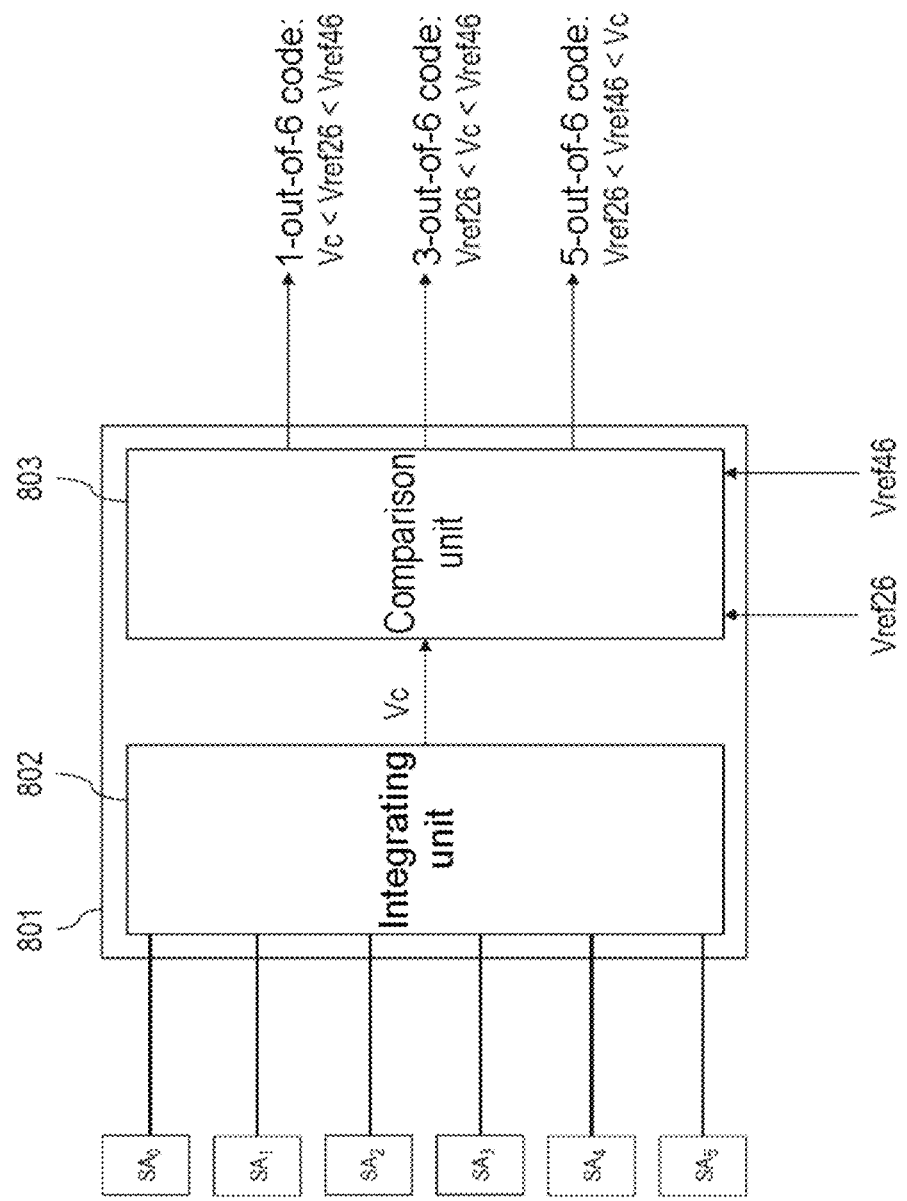
FIG. 8 shows a schematic depiction for a code identification circuit comprising an integrating circuit and a comparison circuit.

FIG. 8 shows a schematic depiction for a code identification circuit 801 comprising an integrating circuit 802 and a comparison circuit 803.

The integrating circuit 802 receives the signals from the measurement amplifiers $SA_0$ to $SA_5$ and transforms time durations into a (cumulated) voltage Vc. This voltage Vc is different depending on what code word was stored in the memory cells that were read with the aid of the measurement amplifiers $SA_0$ to $SA_5$.

The voltage Vc is fed to the comparison circuit 803. A comparison with two threshold values Vref26 and Vref46 can be carried out in said comparison circuit by means of voltage comparators in order to determine whether a code word of a 1-out-of-6 code, of a 3-out-of-6 code or of a 5-out-of-6 code was stored in the memory cells. Accordingly, the comparison unit 803 receives said threshold values Vref26 and Vref46 or determines said threshold values Vref26 and Vref46 likewise by means of the integrating circuit 802 and stores them in order to be able subsequently to utilize them for carrying out the comparison.

The comparison unit 803 yields at its output the information of whether a code word of the 1-out-of-6 code, of the 3-out-of-6 code or of the 5-out-of-6 code is involved. By way of example, a separate line can be provided for this purpose, as illustrated in FIG. 8, which line outputs a predefined signal (e.g. the value "1") for the code respectively identified (in this example, the value "0" is present on the other lines for the codes not identified).

Figure 9:
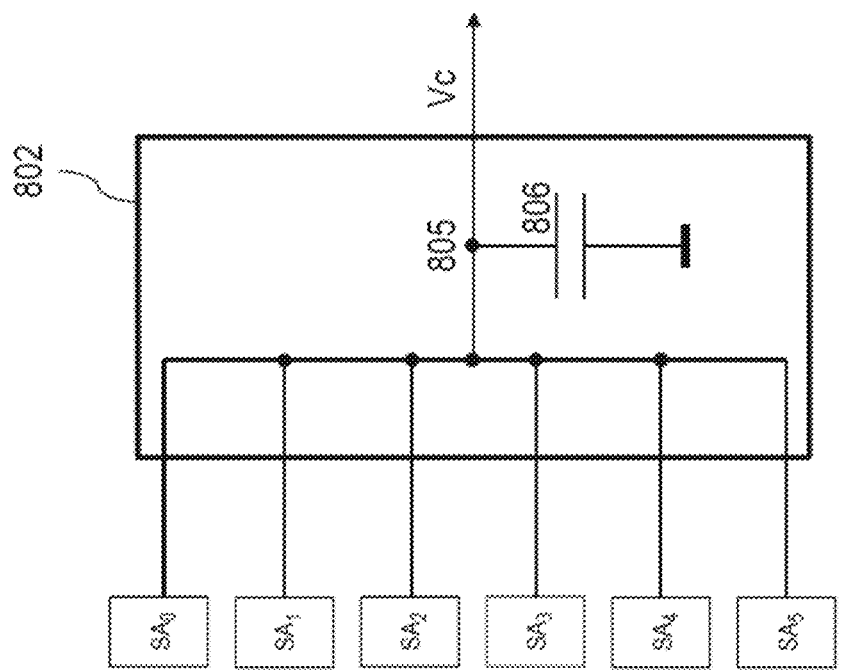
FIG. 9 shows a possible schematic realization of the integrating circuit shown in FIG. 8.

FIG. 9 shows by way of example a possible schematic realization of the integrating circuit 802. The outputs of the measurement amplifiers $SA_0$ to $SA_5$ are combined at a node 805. A capacitor 806 having a capacitance C is arranged between the node 805 and ground. The voltages determined by the measurement amplifiers $SA_0$ to $SA_5$ during a read process are integrated with the aid of the capacitor 806. The voltage Vc is then dropped across the capacitor 806, which voltage results as follows:

$$Vc = Vc0 + \frac{I_0}{C} \cdot (\Delta t_0 + \Delta t_1 + \Delta t_2 + \Delta t_3 + \Delta t_4 + \Delta t_5),$$

wherein

Vc0 represents an offset voltage, $I_0$ represents a current flowing the measurement amplifier $SA_0$ to $SA_5$, C represents the capacitance of the capacitor 806, $\Delta t_0$ to $\Delta t_5$ respectively represent the time duration until a voltage at the associated measurement amplifier $SA_0$ to $SA_5$ has reached a threshold value.

In this case, the threshold value is reached earlier if the cell has a low resistance value. This corresponds to a "fast state" (i.e. a "short time"), which here for example is associated with the value "0". If more time is required to reach the threshold value, the cell accordingly has a higher resistance value. This corresponds to a "slow state" (i.e. a "long time"), which here for example is associated with the value "1".

In this example, a voltage Vc arises per allocation of the six cells read by means of the measurement amplifiers $SA_0$ to $SA_5$. This voltage is different depending on the code word: in this regard a code word of the 3-out-of-6 code has three fast and three slow states, a code word of the 1-out-of-6 code has one fast and five slow states, and a code word of the 5-out-of-6 code has five fast and one slow state.

Voltage values for the code words arise as a result of the integration of the times of different length (until the threshold value is reached).

Next, the voltage values Vc are intended to be compared with the reference values Vref26 and Vref46 such that the code to which the bits read belong can be determined on the basis of the respective voltage value Vc.

For this purpose, the reference value Vref26 is determined on the basis of two fast and four slow states (as if it were a code word of a 2-out-of-6 code) and the reference value Vref46 is determined on the basis of four fast and two slow states (as if it were a code word of a 4-out-of-6 code). Therefore, the integrated voltage value of the reference value Vref26 lies between the integrated voltage values of the code words of the 1-out-of-6 code and of the 3-out-of-6 code and the integrated voltage value of the reference value Vref46 lies between the integrated voltage values of the code words of the 3-out-of-6 code and of the 5-out-of-6 code. Accordingly, by comparing the integrated voltage value Vc with the reference values Vref26 and Vref46, it is possible to deduce the respective code as follows:

A code word of the 1-out-of-6 code is present if the following holds true:

Vc<Vref26<Vref46.

A code word of the 3-out-of-6 code is present if the following holds true:

Vref26<Vc<Vref46.

A code word of the 5-out-of-6 code is present if the following holds true:

Vref26<Vref46<Vc.

On the basis of the output signals supplied by the comparison unit 803, therefore, afterward the code is determined and thus only the frozen bit combination B0 to B5 of the associated circuit block 701, 703 or 705 is processed further.

If, by way of example, with the measurement amplifiers $SA_0$ to $SA_5$, a voltage value Vc results which satisfies the condition Vref26<Vc<Vref46 then a code word of the 3-out-of-6 code is involved. In accordance with FIG. 7 the circuit block 703 having the logic circuit 704 serves for detecting the three fastest bits of the 3-out-of-6 code. Consequently, on the basis of the signal which is provided by the comparison circuit 803 of the code identification circuit 801 and which identifies the 3-out-of-6 code, the circuit block 703 is selected in order to process further the bit combination B0 to B5 present there. The other circuit blocks 701 and 705, which detect code words of the 1-out-of-6 code or of the 5-out-of-6 code, respectively, in accordance with the present example, are not activated in this case for forwarding the bits B0 to B5 stored in them (i.e. these circuit blocks are masked since a code word of the 3-out-of-6 code has been identified).

Determining the Reference Values Vref26 and Vref46

The reference value Vref26 is an allocation of the six cells which corresponds to a code word of the 2-out-of-6 code. There are thus two fast states and 4 slow states. As a result of the integration described above, the reference value Vref26 arises as a voltage value between the integrated voltage Vc of a code word of the 1-out-of-6 code and the integrated voltage Vc of a code word of the 3-out-of-6 code.

Correspondingly, the reference value Vref46 is an allocation of the six cells which corresponds to a code word of the 4-out-of-6 code. There are thus four fast states and 2 slow states. As a result of the integration described above, the reference value Vref46 arises as a voltage value between the integrated voltage Vc of a code word of the 3-out-of-6 code and the integrated voltage Vc of a code word of the 5-out-of-6 code.

Figure 11:
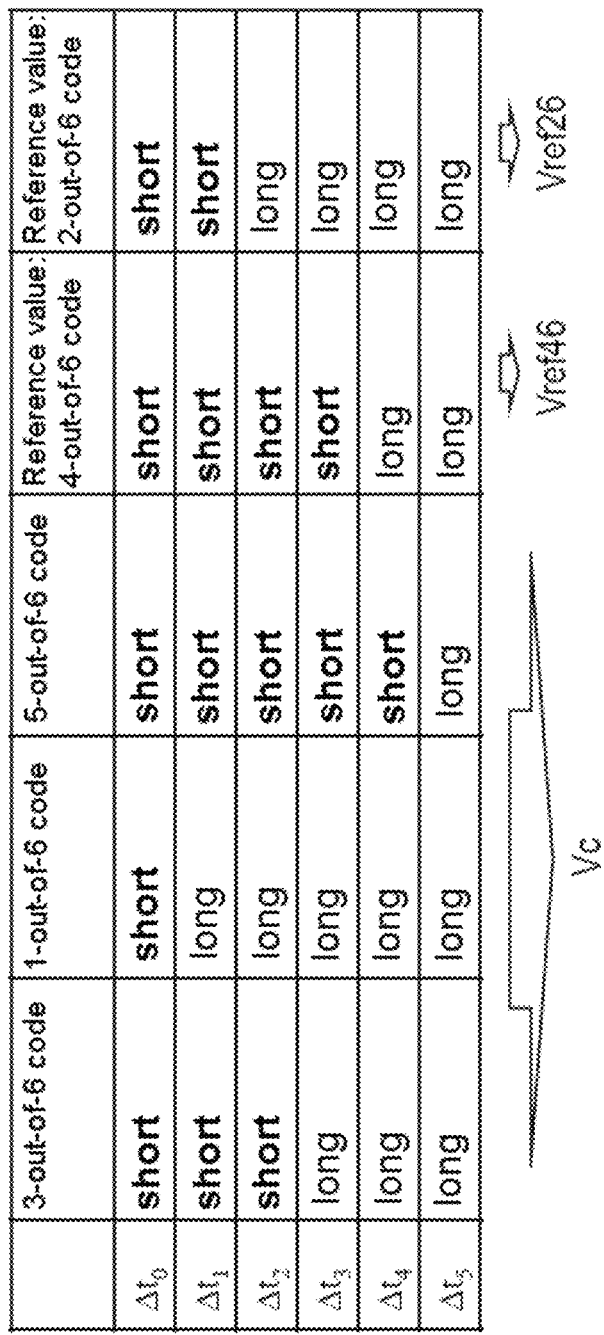
FIG. 11 shows a table for illustrating long and short time durations used as a basis for the integration of a voltage value depending on the respective code words.

This relationship—including for the integrated voltages of the code words of the 1-out-of-6 code, of the 3-out-of-6 code and of the 5-out-of-6 code—is summarized once again in FIG. 11.

By way of example, integration times $\Delta t_0$ to $\Delta t_5$ are entered in the left-hand column of the table shown in FIG. 11. It should be noted here that the indices of the integration times $\Delta t_0$ to $\Delta t_5$ can vary for the representation of the table. What is crucial is that per k-out-of-n code there are in each case k short integration times and (n–k) long integration times. Each integration time (whether short or long) yields a current portion into the capacitor 806 (cf. FIG. 9).

In one embodiment, the reference values Vref26 and Vref46 are also determined together with each read process. By way of example, for this purpose, at least one code word of the 2-out-of-6 code and at least one code word of the 4-out-of-6 code can be stored in a predefined memory area. During the reading of the cells having the payload data (which are present in the form of code words of the 1-out-of-6 code, of the 3-out-of-6 code or of the 5-out-of-6 code), the reference values stored beforehand are also read in order thus to obtain comparison voltages that are as suitable as possible and to ensure that the comparison operations function with high accuracy.

The reference values Vref26 and Vref46 are thus determined by a process of read access to an area in which a corresponding reference value was stored previously in a targeted manner. During such a read access, the measurement amplifiers $SA_0$ to $SA_5$ supply signals that are integrated by means of the circuit shown in FIG. 9. In contrast to the voltage Vc shown in FIG. 9, the respective reference value Vref26 or Vref46 is generated and is buffer-stored preferably for a predefined time duration for at least one subsequent comparison.

Exemplary System Implementation: MRAM

Figure 10:
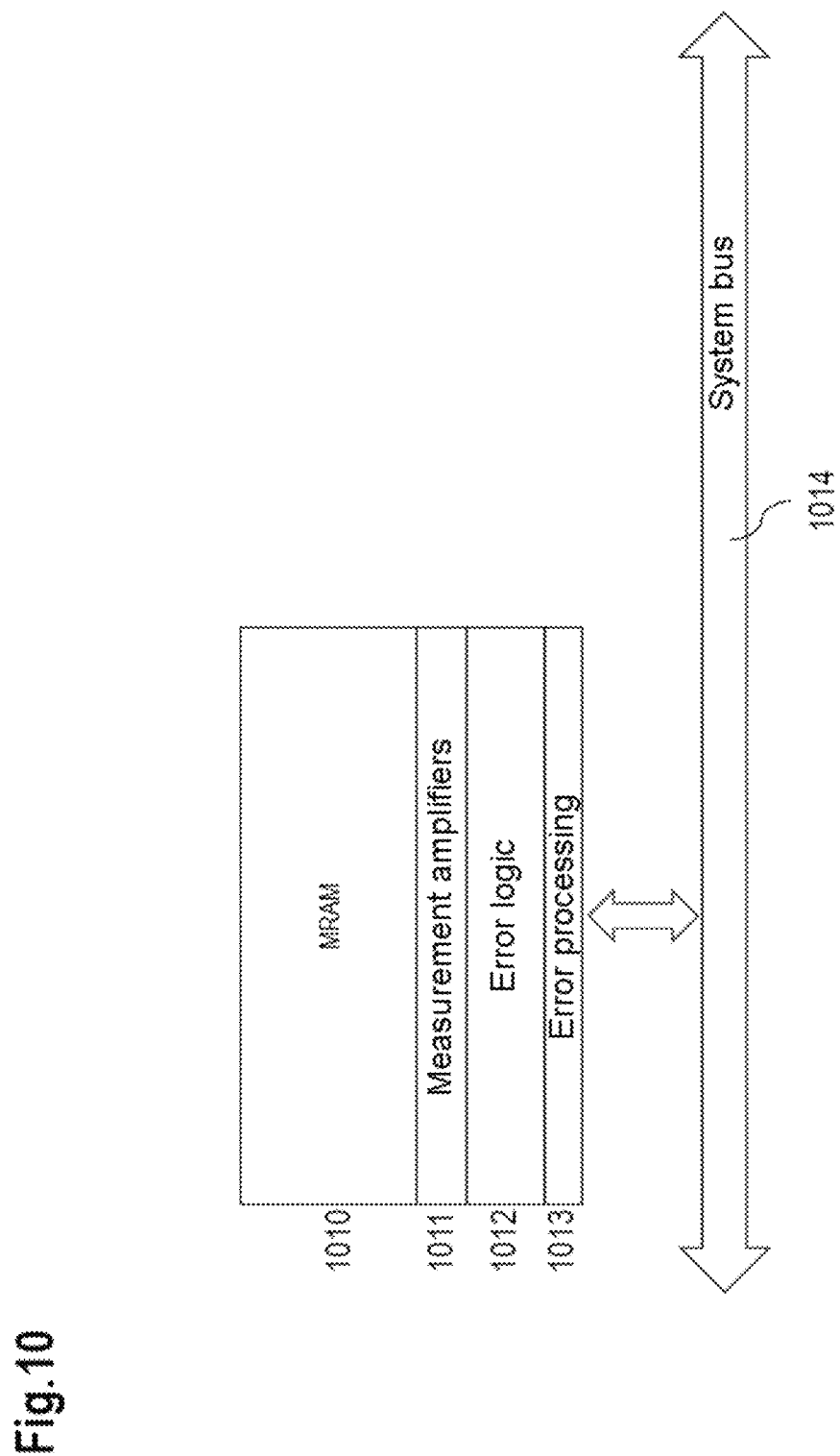
FIG. 10 shows an example system implementation for an MRAM.

FIG. 10 shows an example system implementation for an MRAM 1010 comprising a multiplicity of memory cells. The values stored in the memory cells are read out via measurement amplifiers 1011 and an assignment of the memory cells to logic (0 or 1) states is effected with the aid of the error logic circuit 1012 described here. Said error logic circuit 1012 comprises for example the above-explained determination of the k fastest states of a k-out-of-n code. As soon as the k fastest states are present, the outputs of the memory cells (the outputs of the measurement amplifiers which are assigned to the memory cells and which indicate the states of the memory cells) are frozen. This is done for example by means of the circuit described in FIG. 5, according to which the latches 505 to 510 are "latched" (halted or frozen) via the connection 502, such that the k fastest states (they are the 0-states in the example described) are present at the outputs of the latches 505 to 510. Following a corresponding signal communicated via the connection 502, these states can no longer change and are frozen until a release is effected again (e.g. also via the connection 502).

The error processing circuit 1013 can use an error code, for example. The error code can be an error detecting code that has check bits formed from the bits from different groups of n bits. The check bits can be formed for example by means of a Berger code or by means of a BCH code.

The error processing circuit 1013 can comprise, as explained, error detection circuit and/or error correction circuit. The error processing circuit 1013 is coupled to a system bus 1014.

The measurement amplifier can access the memory in each case in groups of n bits. A bit sequence read from n memory cells in each case can thus be processed further as a group of n bits. In the error-free case, each of the bit sequences represents a code word of a k-out-of-n code. By way of example, n can be equal to 6 or equal to 8.

Further Configurations and Advantages

The circuit blocks 701, 703 and 705 all yield the k fastest states in each case. For circuit blocks which process k-out-of-n codes where k≥1, a security or plausibility check can thus be implemented to the effect of checking whether for at least two circuit blocks e.g.

the fastest state is identified for the same bit;

the second fastest state is identified for the same bit (provided that k>1 holds true for the circuit blocks), the i-fastest state is identified for the same bit (provided that it holds true for the circuit blocks that k is at least equal to i in magnitude).

This consideration is based on the fact that all circuit blocks involved should identify the same bit as the fastest bit, provided that the k-out-of-n code mapped by the respective circuit block has a value of corresponding magnitude for k.

In this way it is possible to check whether an error is present in one of the circuit blocks. If more than two circuit blocks are taken into account, it is possible to ascertain on the basis of a majority decision, for example, which circuit block or which circuit blocks is/are possibly defective.

Although the disclosure has been more specifically illustrated and described in detail by means of the at least one exemplary embodiment shown, nevertheless the disclosure is not restricted thereto and other variations can be derived therefrom by the person skilled in the art, without departing from the scope of protection of the disclosure.

The invention claimed is:

1. A method for detecting a code word, wherein the code word is a code word of one of at least two codes, comprising:
   reading n states from memory cells of a memory, respectively;
   determining the n states in a time domain for each of the at least two codes;
   reading n additional states from further memory cells, respectively, and determining at least one reference value therefrom; and
   taking the at least one reference value as a basis for determining which of the at least two codes is the correct code.

2. The method as claimed in claim 1, comprising further processing the code word of the correct code.

3. The method as claimed in claim 1, wherein each of the at least two codes is a k-out-of-n code having an identical value n and different values for k.

4. The method as claimed in claim 3, wherein the at least two codes comprise a first k1-out-of-n code and a second k2-out-of-n code, wherein the reference value is determined such that it is based on a bit sequence corresponding to a k3-out-of-n code, wherein the value k3 lies between the values k1 and k2.

5. The method as claimed in claim 1, wherein the n states are determined at least partly in parallel and/or at least partly simultaneously.

6. The method as claimed in claim 1, wherein the n states are read from the further memory cells of the memory or from some other memory.

7. The method as claimed in claim 1, wherein taking the at least one reference value as a basis for determining which of the at least two codes is the correct code comprises:
   determining an integrated signal by integration of signals supplied by the n cells; and
   comparing the integrated signal with the at least one reference value.

8. The method as claimed in claim 1, wherein the at least one reference value is determined by:

determining a further integrated signal by integration of signals supplied by the n further cells.

9. The method as claimed in claim 1, wherein the at least one reference value is determined for each read process of the cells from the memory.

10. The method as claimed in claim 1, wherein the memory cells are read in groups of n memory cells.

11. The method as claimed in claim 1, wherein the memory cells are complementary memory cells of a complementary memory.

12. The method as claimed in claim 1, wherein the states are determined in the time domain by a number of k fastest states being determined.

13. The method as claimed in claim 12, wherein the fastest states are 0-states.

14. The method as claimed in claim 12, wherein the remaining states that do not belong to the k fastest states are correspondingly set.

15. The method as claimed in claim 1, wherein the memory comprises at least one of the following memories:
    floating gate cells;
    PCRAM,
    RRAM,
    MRAM,
    MONOS components,
    nanocrystal cells, and
    ROM.

16. A device for detecting a code word, wherein the code word is a code word of one of at least two codes, comprising a processing circuit configured to:
    read n states from memory cells of a memory, respectively;
    determine the n states in a time domain for each of the at least two codes;
    read n additional states from further memory cells, respectively, and determining at least one reference value therefrom; and
    take the at least one reference value as a basis for determining which of the at least two codes is the correct code.

17. A device for detecting a code word, wherein the code word is a code word of one of at least two codes, comprising:
    means for reading n states from memory cells of a memory, respectively;
    means for determining the n states in a time domain for each of the at least two codes;
    means for reading n additional states from further memory cells and for determining at least one reference value on the basis of the states read from the further memory cells; and
    means for determining which of the at least two codes is the correct code on the basis of the at least one reference value.

18. A non-transitory computer readable storage medium containing instructions which are loadable into a memory of a digital computer, wherein such instructions, upon execution, are suitable for carrying out a method, comprising:
    reading n states from memory cells of a memory, respectively;
    determining the n states in a time domain for each of the at least two codes;
    reading n additional states from further memory cells, respectively, and determining at least one reference value therefrom; and
    taking the at least one reference value as a basis for determining which of the at least two codes is the correct code.

\* \* \* \* \*